(12) United States Patent
Biggs et al.

(10) Patent No.: US 7,911,761 B2
(45) Date of Patent: Mar. 22, 2011

(54) FAULT-TOLERANT MATERIALS AND METHODS OF FABRICATING THE SAME

(75) Inventors: Silmon James Biggs, Los Gatos, CA (US); Matthew Kurt Senesky, Berkeley, CA (US)

(73) Assignee: Bayer MaterialScience AG, Leverkusen (DE)

( * ) Notice: Subject to any disclaimer, the term of this patent is extended or adjusted under 35 U.S.C. 154(b) by 506 days.

(21) Appl. No.: 11/956,269

(22) Filed: Dec. 13, 2007

(65) Prior Publication Data

US 2008/0180875 A1 Jul. 31, 2008

Related U.S. Application Data

(60) Provisional application No. 60/870,059, filed on Dec. 14, 2006.

(51) Int. Cl.
*H01G 2/14* (2006.01)
(52) U.S. Cl. ........ 361/273; 361/272; 361/278; 361/277; 361/283.1; 361/292
(58) Field of Classification Search .................. 361/273, 361/272, 277–278, 302–305, 301.1, 301.4, 361/283.1, 290–292
See application file for complete search history.

(56) References Cited

U.S. PATENT DOCUMENTS

| | | | |
|---|---|---|---|
| 4,326,762 A | 4/1982 | Hockenbrock et al. | |
| 4,433,359 A | 2/1984 | Hamabe et al. | |
| 4,434,452 A * | 2/1984 | Hamabe et al. | 361/304 |
| 5,305,178 A | 4/1994 | Binder et al. | |
| 5,636,100 A | 6/1997 | Zheng et al. | |
| 5,696,663 A * | 12/1997 | Unami et al. | 361/305 |
| 5,717,563 A | 2/1998 | MacDougall et al. | |
| 6,111,743 A | 8/2000 | Lavene | |
| 6,184,044 B1 * | 2/2001 | Sone et al. | 438/3 |
| 6,316,084 B1 | 11/2001 | Claus et al. | |
| 6,339,527 B1 * | 1/2002 | Farooq et al. | 361/305 |
| 6,366,193 B2 | 4/2002 | Duggal et al. | |
| 6,388,553 B1 | 5/2002 | Shea et al. | |
| 6,532,145 B1 * | 3/2003 | Carlen et al. | 361/508 |
| 6,631,068 B1 | 10/2003 | Lobo | |
| 7,008,838 B1 | 3/2006 | Hosking et al. | |
| 7,092,238 B2 * | 8/2006 | Saito et al. | 361/329 |
| 7,099,141 B1 | 8/2006 | Kaufman et al. | |
| 7,104,146 B2 | 9/2006 | Benslimane et al. | |
| 7,298,603 B2 * | 11/2007 | Mizuno et al. | 361/303 |
| 7,394,641 B2 * | 7/2008 | Won et al. | 361/277 |
| 7,436,646 B2 * | 10/2008 | Delince et al. | 361/273 |

OTHER PUBLICATIONS

Begley, M. et al., "The electro-mechanical response of highly compliant substrates and thin stiff films with periodic cracks," *International Journal of Solids and Structures*, 42: 5259-5273, 2005.
Boyle, W. et al., "Departure from Paschen's law of breakdown in gases," *The Physical Review*, Second Series, 97(2): 255-259, 1955.

(Continued)

*Primary Examiner* — Nguyen T Ha
(74) *Attorney, Agent, or Firm* — John E. Mrozinski, Jr.; Noland J. Cheung (57) ABSTRACT

The present invention provides compliant/stretchable electroactive materials and devices made from those materials which exhibit fault-tolerant properties, i.e., self-healing/clearing properties. The present invention also provides systems, which incorporate the subject materials and/or devices, as well as methods of fabricating the subject materials and devices.

29 Claims, 5 Drawing Sheets

OTHER PUBLICATIONS

Delille, R. et al., "Novel Compliant Electrodes Based on Platinum Salt Reduction," *Smart Structures and Materials 2006: Electroactive Polymer Actuators and Devices (EAPAD)*, edited by Yoseph Bar-Cohen, *Proceedings of SPIE*, 6168(61681Q), 2006.

Hansen, G., "High Aspect Ratio Sub-Micron and Nano-scale Metal Filaments," *SAMPE Journal*, 41(2): 1-11, 2005.

Lacour, S. et al., "Mechanisms of reversible stretchability of thin metal films on elastomeric substrates," *Applied Physics Letters 88*, 204103, 2006.

Lacour, S. et al., "Stretchable interconnects for elastic electronic surfaces," *Proceedings of the IEEE on Flexible Electronics Technology*, 93(8): 1459-1467, 2005.

Reed, C. et al., "The Fundamentals of Aging in HV Polymer-film Capacitors," *IEEE Transactions on Dielectrics and Electrical Insulation*, 1(5): 904-922, 1994.

Sokolova, M. et al., "Influence of a Bias Voltage on the Characteristics of Surface Discharges in Dry Air," *Plasma Processes and Polymers*, 2: 162-169, 2005.

Standard Test Methods for Rubber Deterioration—Cracking in an Ozone Controlled Environment, *ASTM International*, D 1149-07.

Yoshio, O., "Ablation Characteristics of Silicone Insulation," *Journal of Polymer Science: Part A: Polymer Chemistry*, 36: 233-239, 1998.

Yuan, W. et al., "New Electrode Materials for Dielectric Elastomer Actuators," *Proc. SPIE*, 6524(65240N), 2007.

* cited by examiner

FAULT-TOLERANT MATERIALS AND METHODS OF FABRICATING THE SAME

FIELD OF THE INVENTION

The present invention is related to the field of materials having adjustable conductivity and/or a physical structure or geometry which promote self-healing or clearing properties. In a particular application, the present invention is directed to thin film capacitors made of complaint or stretchable materials, i.e., electrodes and dielectrics, having such properties.

BACKGROUND

Capacitors are used to store electrical charge or energy, which stored energy can then be instantaneously released when needed. Capacitors can also function as filters by passing alternating current (AC) while blocking direct current (DC), and are also useful to prevent current and voltage transients.

Typically, a capacitor comprises two electrodes or electrode plates facing each other, with an insulating dielectric between them. The electrodes are made of a highly conductive material (often metal), and the dielectric is often made of a polymer material. Very thin polymer film capacitors are widely used, and are particularly useful in high voltage applications having space constraints. An ongoing challenge with these capacitors is slowing the rate at which they age and, thus, extending the useful life of the capacitors. With a greater understanding of the aging process undergone by thin film polymer capacitors, significant improvements have been made in their construction; namely, a move away from aluminum foil electrodes to electrodes formed by vapor deposition of very thin metal films (i.e., on the order of 20 to 100 nm), usually made of aluminum, gold or zinc, onto the polymer film. See, e.g., Reed et al., "The Fundamentals of Aging in HV Polymer-film Capacitors," *IEEE Transactions on Dielectrics and Electrical Insulation*, Vol. 1 No. 5, October 1994, incorporated herein by reference.

Figure 1:
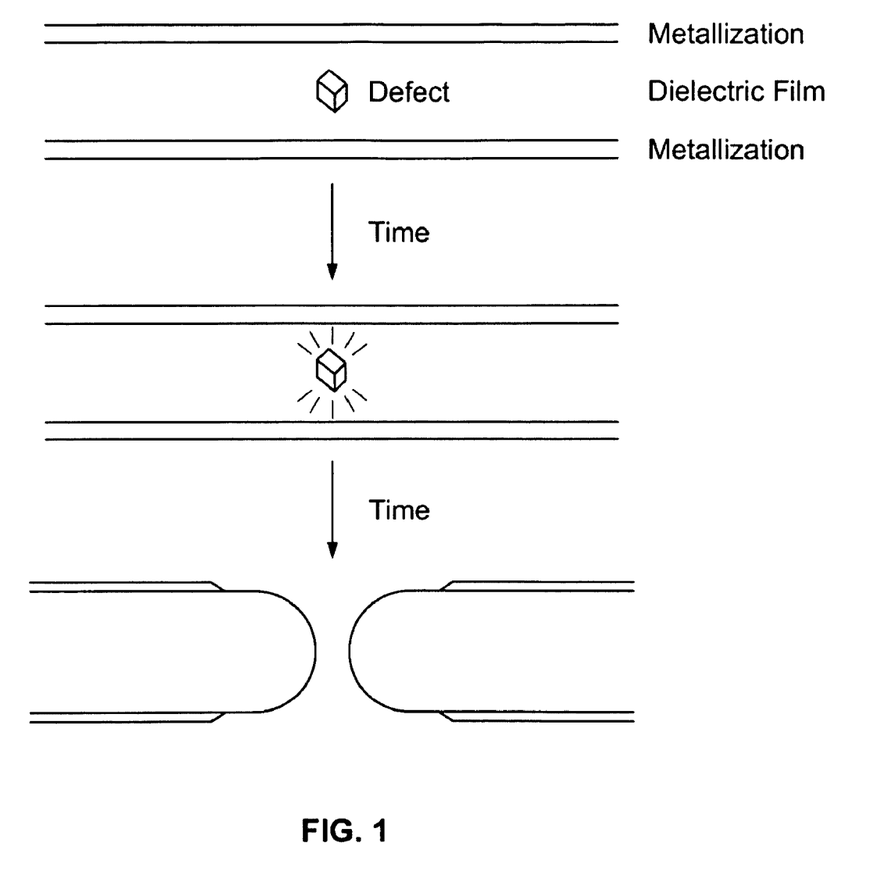
FIG. 1 is a schematic representation of the self-healing/clearing process undergone by a metallized dielectric film.

Metallized thin film capacitors can be constructed so as to exhibit a "self-healing" ability (also referred to as "self-clearing"), i.e., the ability to recover from dielectric breakdown events. Dielectric breakdown is due to either extrinsic effects (e.g., material defects or porosity) or intrinsic effects (e.g., thermal runaway). When breakdown occurs, an electrical arc causes a short circuit between the metalized electrodes of the capacitor, and there is an in-rush of current through the fault in the dielectric material. This shorting event occurs very quickly, at a rate in the range of nano- or micro-seconds. (Such a defect within the capacitor and the resulting dielectric breakdown is schematically illustrated in the first two frames of FIG. 1.) Without self-healing capability, a single dielectric breakdown results in catastrophic failure and the entire capacitor can no longer hold or store a charge. For many applications, this failure is harmful to other components in the circuit and can result in catastrophic damage to the entire circuit. At worst, the localized heating that occurs at a short circuit may ignite the dielectric material, causing the circuit to burn up.

With capacitors having so-called self-healing properties, catastrophic failures are obviated. When a short circuit occurs as described above, the current therethrough vaporizes small areas of the metallized layer surrounding the short circuit thereby interrupting the flow of current (schematically illustrated in the last frame of FIG. 1) and returning the capacitor to normal function, usually with only a small reduction in capacitance. Thus, the self-healing process allows multiple isolated failure events to occur within the capacitor before an appreciable loss of capacitance is experienced. This confers better circuit stability, and extends the useful life of the capacitor and the circuit in which it is employed. The typical expiration of these types of capacitors is not catastrophic, but rather, is gradual due to the progressive loss of electrode material from repeated "self-clearing" events which eventually result in an open circuit condition.

This self-clearing process occurs very quickly in metallized film capacitors, typically on the order of nanoseconds to microseconds, at which rate, any disruption in capacitor performance is nominal. For such "fast clearing" to occur, the electrode material must be highly conductive. High conductivity enables high current densities at the fault which in turn causes the electrode to heat rapidly. Another requirement for fast clearing to take place is that the electrode material must be able to be made thin enough to vaporize and/or oxidize. Metals such as aluminum and gold fit this profile, and as such, are commonly used to metalize thin film dielectrics.

Irrespective of the benefits of self-healing properties, the cumulative effect of repeated clearing events results in a progressive loss of capacitance in self-healing capacitors. As such, an alternative or additional approach to extending the life of metallized capacitors has been developed. This approach involves segmenting the metallized films. See, e.g., U.S. Pat. Nos. 4,433,359, 5,717,563 and 6,631,068. Such segmentation involves forming a non-metallized pattern within the metal film to form a plurality of metallized segments. The non-metallized pattern provides unmetalized margins that interlink the metallized segment by small fuses. If a short circuit occurs within a segment, the fuses that interlink that segment to adjacent segments open and remove the segment from capacitor, thereby avoiding a catastrophic failure of the capacitor and the circuit in which the capacitor is used.

A significant downside to this approach, however, is that it requires a high degree of redundancy to be built into the device, thereby increasing the likelihood of reliability problems. Additionally, segmentation of the electrode can significantly increase the cost to fabricate the capacitors due to the loss of material involved and the additional process steps necessary to segment the electrodes.

Still yet, improvements to self-clearing and segmentation of thin metal electrodes which minimize the aforementioned disadvantages continue to be made. See, e.g., U.S. Pat. Nos. 6,631,068 and 7,099,141. These improvements, however, have thus far been limited to relatively stiff or rigid metallized films, and have not been applied to complaint or stretchable film materials. In applications such as dielectric elastomer actuators, in which capacitive structures are subject to actuation strains greater than about 5%, flat metallized films will typically crack within just a few actuation cycles. Even if the cracks are initially short and disconnected, for example in the case of sputtered metal coatings, commercial applications commonly require millions of strain cycles, a regime that propagates and connects cracks thereby interrupting electrical continuity.

As such, the advent of dielectric elastomer materials, also referred to as "electroactive polymers" (EAPs) provides a true technological advancement. An EAP transducer comprises two thin film electrodes having elastic characteristics and separated by a thin elastomeric dielectric polymer. When a voltage difference is applied to the electrodes, the oppositely-charged electrodes attract each other thereby compressing the polymer dielectric layer therebetween. As the electrodes are pulled closer together, the dielectric polymer film becomes thinner (the z-axis component contracts) as it expands in the planar directions (the x- and y-axes components expand). Furthermore, the like (same) charge distributed across each elastic film electrode causes the conductive particles embedded within that electrode to repel one another, thereby contributing to the expansion of the elastic electrodes and dielectric films.

Especially for actuator and generator applications, a number of design considerations favor the selection and use of advanced electroactive polymer technology based transducers. These considerations include potential force, power density, power conversion/consumption, size, weight, cost, response time, duty cycle, service requirements, environmental impact, etc. Electroactive polymer technology excels in each of these categories relative to other available technologies and, as such, offers an ideal replacement for piezoelectric, shape-memory alloy (SMA) and electromagnetic devices such as motors and solenoids. Examples of EAP devices and their applications are described in U.S. Pat. Nos. 6,940,221; 6,911,764; 6,891,317; 6,882,086; 6,876,135; 6,812,624; 6,809,462; 6,806,621; 6,781,284; 6,768,246; 6,707,236; 6,664,718; 6,628,040; 6,586,859; 6,583,533; 6,545,384; 6,543,110; 6,376,971 and 6,343,129; and U.S. Published Patent Application Nos. 2005/0157893; 2004/0263028; 2007/0217671; 2004/0124738; 2004/0046739; 2004/0008853; 2003/0214199; 2002/0175598; and 2002/0122561, the entireties of which are incorporated herein by reference.

In light of the realized advantages of devices employing compliant or stretchable electroactive materials, the need for self-healing properties in these kinds of materials is imperative. The inventors of the subject invention are not aware of any prior art electroactive polymer actuators that exhibit repeatable self-healing and reliable long-term conductivity consistent with commercially viable product lifetimes. To the contrary—failure modes of prior art devices are unpredictable and catastrophic. Thus, it would be highly advantageous to fabricate and provide electroactive materials and devices of a compliant or stretchable thin film construct having self-healing properties which overcome the limitations of the prior art.

SUMMARY OF THE INVENTION

The present invention includes novel electroactive materials and devices comprised thereof which exhibit fault-tolerant properties, i.e., self-healing/clearing properties, which greatly improve upon prior art materials and devices, and which enable broader ranging applications than those of the prior art. The present invention also provides systems which incorporate the subject materials and/or devices, as well as methods of fabricating the subject materials and devices.

The subject materials are typically in the form of compliant and/or stretchable electroactive films. In one variation, the films are used to form a compliant capacitive structure wherein a compliant dielectric layer is sandwiched between a pair of compliant electrode layers. In another variation, the electrode layers having a physical construct or geometry that enables them to be stretched or extended in a manner that provides clearing properties.

The electrode and dielectric materials are selected to optimize fault tolerance while retaining the high performance characteristics required of such compliant/stretchable films. In particular, the electrode and/or dielectric materials comprise elastomeric polymers having properties which enable them to effectively and efficiently isolate faults, and thereby increase the effective dielectric strength. With greater dielectric strength, higher electric fields may be employed which in turn enables improved device (i.e., transducer) performance.

The subject devices may be employed as transducers for application in actuators, generators, sensors, and the like, or as components thereof. Such devices and/or components may form a system of the present invention where the system may further comprise a power supply. The power supply may be selected to provide an optimum current to enable maximum performance by the transducer. Additionally or alternatively, the system may comprise a current-limiting device configured to limit the amount of current supplied to the subject devices.

These and other features, objects and advantages of the invention will become apparent to those persons skilled in the art upon reading the details of the invention as more fully described below.

BRIEF DESCRIPTION OF THE DRAWINGS

The invention is best understood from the following detailed description when read in conjunction with the accompanying schematic drawings, where variation of the invention from that shown in the figures is contemplated. To facilitate understanding of the invention description, the same reference numerals have been used (where practical) to designate similar elements that are common to the drawings. Included in the drawings are the following figures.

DETAILED DESCRIPTION OF THE INVENTION

Before describing particular embodiments of the materials, devices and systems of the present invention, a discussion of compliant electroactive capacitive structures and their material properties and performance characteristics is provided.

Figure 2A:
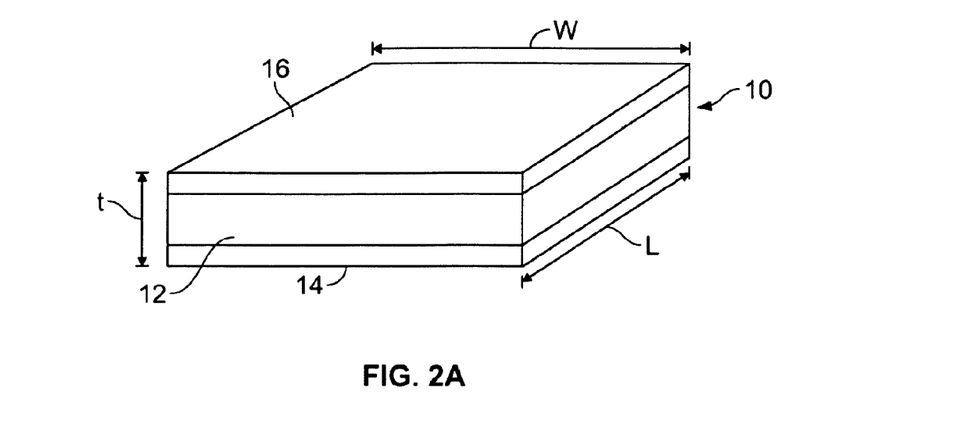
FIGS. 2A and 2B illustrate a top perspective view of a transducer before and after application of a voltage in accordance with one embodiment of the present invention.
Figure 2B:
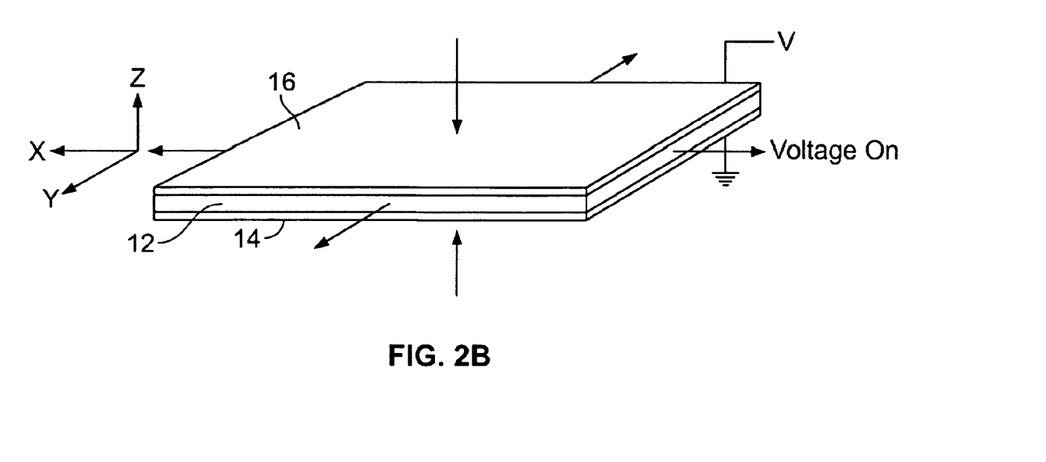

FIGS. 2A and 2B illustrate a capacitive structure in the form of an electroactive film or membrane 10. A thin elastomeric dielectric film or layer 12 is sandwiched between compliant or stretchable electrode plates or layers 14 and 16, thereby forming a capacitive structure or film. The length "l" and width "w" of the dielectric layer, as well as that of the composite structure, are much greater than its thickness "t". Typically, the dielectric layer has a thickness in range from about 1 µm to about 100 µm, with the total thickness of the structure in the range from about 1 µm to about 10 cm. Additionally, it is desirable if possible to select the elastic modulus, thickness, and/or the microgeometry of electrodes 14, 16 such that the additional stiffness they contribute to the actuator is generally less than the stiffness of the dielectric layer 12, which has a relatively low modulus of elasticity, i.e., less than about 100 MPa, but is likely thicker than each of the electrodes. Electrodes suitable for use with these compliant capacitive structures are those capable of withstanding cyclic strains greater than 0.1% without failure due to mechanical fatigue.

As seen in FIG. 2B, when a voltage is applied across the electrodes, the unlike charges in the two electrodes 14, 16 are attracted to each other and these electrostatic attractive forces compress the dielectric film 12 (along the Z-axis). Additionally, the repulsive forces between like charges in each electrode tend to stretch the dielectric in plane (along the X- and Y-axes), thereby reducing the thickness of the film. The dielectric film 12 is thereby caused to deflect with a change in electric field. As electrodes 14, 16 are compliant, they change shape with dielectric layer 12. Generally speaking, deflection refers to any displacement, expansion, contraction, torsion, linear or area strain, or any other deformation of a portion of dielectric film 12. Depending on the form fit architecture, e.g., a frame, in which capacitive structure 10 is employed (collectively referred to as a "transducer"), this deflection may be used to produce mechanical work. Various different transducer architectures are disclosed and described in the above-identified patent references.

With a voltage applied, the transducer film 10 continues to deflect until mechanical forces balance the electrostatic forces driving the deflection. The mechanical forces include elastic restoring forces of the dielectric layer 12, the compliance or stretching of the electrodes 14, 16 and any external resistance provided by a device and/or load coupled to transducer 10. The resultant deflection of the transducer 10 as a result of the applied voltage may also depend on a number of other factors such as the dielectric constant of the elastomeric material and its size and stiffness. Removal of the voltage difference and the induced charge causes the reverse effects.

In some cases, the electrodes 14 and 16 may cover a limited portion of dielectric film 12 relative to the total area of the film. This may be done to prevent electrical breakdown around the edge of the dielectric or achieve customized deflections in certain portions thereof. Dielectric material outside an active area (the latter being a portion of the dielectric material having sufficient electrostatic force to enable deflection of that portion) may be caused to act as an external spring force on the active area during deflection. More specifically, material outside the active area may resist active area deflection by its contraction or expansion.

The dielectric film 12 may be pre-strained. The pre-strain allows the dielectric film 12 to deflect more and provide greater mechanical work. Pre-strain of a film may be described as the change in dimension in a direction after pre-straining relative to the dimension in that direction before pre-straining. The pre-strain may comprise elastic deformation of the dielectric film and be formed, for example, by stretching the film in tension and fixing one or more of the edges while stretched. The pre-strain may be imposed at the boundaries of the film using a rigid frame or may be implemented for only a portion of the film.

The transducer structure of FIGS. 2A and 2B and other similar compliant structures and the details of their constructs are more fully described in many of the above-referenced patents and publication.

The performance characteristics, i.e., force and stroke (displacement), of an electroactive transducer increase with the square of the strength of the electric field applied to the transducer. To achieve maximum performance, as high an electric field achievable by the dielectric is set by the material's dielectric strength. The dielectric strength is determined both by the material's natural properties (so-called "intrinsic strength") as well as by the preparation or manufacture of the material, such as the introduction of imperfections or contaminants (commonly referred to as "faults") within the material. These faults can be present initially, or may be latent and develop over time as the dielectric is stressed by repeated use. As discussed in the background section herein, if nothing is done to isolate these faults, catastrophic failure is inevitable. Without self-healing capabilities, avoiding catastrophic failure in compliant thin film electroactive films requires use of electric fields which are significantly lower than optimum.

Development of high performance compliant or stretchable capacitive structures by the inventors has been achieved in part by striking a balance between several desirable material and performance characteristics which are known to offset each other. For example, with respect to the subject electrodes, two desirable but offsetting properties are high conductivity and low mechanical stiffness (i.e., having a low modulus of elasticity). It is well understood that the greater the thickness of a conductor, the better its ability to conduct current. However, the thicker the conductor, the less flexible it is. As such, these properties collectively define a set of upper and lower limits on an electrode's thickness.

In addition to exhibiting the necessary and desirable properties (e.g., high conductivity, low elastic modulus) for EAP applications, for example, the capacitive structures must be able to endure extended use. Accordingly, the present invention provides such complaint or stretchable capacitive structures possessing desirable self-healing properties while keeping within the electrode thickness requirements necessary to ensure high performance characteristics.

As discussed above, a primary aspect of self-healing capacitive structures is the ability of compliant or stretchable electrodes to "clear". However, this ability and its relationship to an electrode's thickness and composition in the context of electroactive polymers have not previously been well understood by those skilled in the art.

In addition to comprising compliant or stretchable electrode material which is highly "clearable," another feature of the capacitive structures of the present invention is the provision of a dielectric material that exhibits minimal "tracking" upon heating. Tracking is the deposition of sooty conductive combustion byproducts, e.g., carbon, which deposit on the dielectric surface when "arcing" (creation of plasma) takes place across the electrodes between which the dielectric is positioned as a result of the high electric field at a fault site within the dielectric material. Tracking is undesirable as the conductive soot perpetuates the short circuit between the electrodes during a fault event. Thus, even if an electrode material has sufficient clearing ability, if too much tracking occur, self-healing is not optimized.

The inventors hereof have found that tracking may be minimized by the proper selection of the electrode material. Electrode materials which lose conductivity (i.e., become insulating) during the clearing process rather than combust under these conditions minimize production of carbon particulate. Electrodes comprised of polyaniline (PANI) or poly3,4-ethylenedioxythiophene (PEDOT), for example, undergo accelerated oxidation and lose conductivity at elevated temperatures. Another mechanism, applicable to single-wall carbon nanotube electrodes (SWCNT), relies on the inherently low volume of electrode material to limit the reserve of carbon available for particulate production. The dielectric material also plays a role in limiting tracking, with some polymer dielectrics being known to limit carbon particulate production. Three exemplary classes of elastomeric dielectrics which meet this criterion include but are not limited to silicones, acrylics, and polyurethanes.

Figure 3:
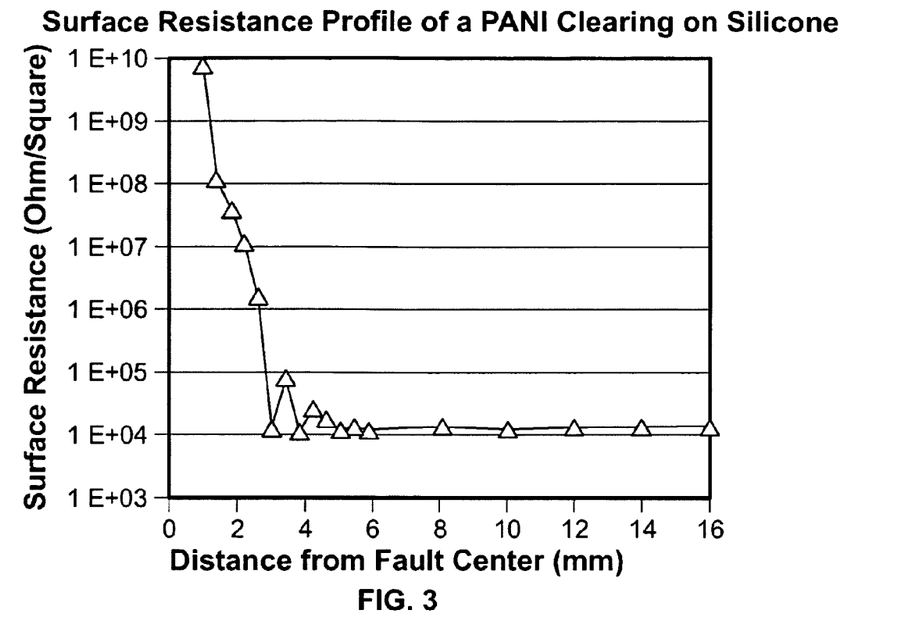
FIG. 3 is a graph of surface resistivity profile of a compliant capacitive structure of the present invention.

In one experiment conducted by the inventors, a thin film capacitive structure formed of polyaniline electrodes and a silicone dielectric was used. A suitable voltage was operatively applied to activate the capacitive film, and the film was intentionally damaged to initiate a clearing event. The surface resistivity of the cleared area was then measured to verify a successful clearing, i.e., sufficient removal of the electrode material without excessive tracking on the dielectric material. As the graph in FIG. 3 reflects, within about 3 mm from the center of the fault, the surface resistivity of the electrode has become effectively insulating, i.e., greater than about $1 \times 10^6$ ohm/square, thereby effectively isolating the fault from the rest of the structure.

Figure 4:
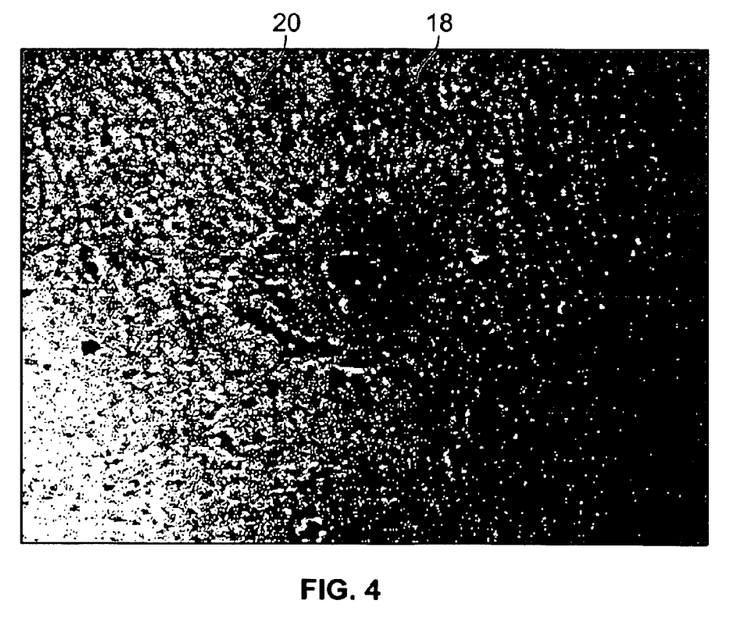
FIG. 4 is a microscope image of a clearing that has taken place on a capacitive structure of the present invention comprising single-wall carbon nanotube (SWCNT) electrodes on silicone dielectric.

Another feature of the self-healing capabilities of one variation of the subject capacitive structures is the relative rates at which the electrode material is cleared (or rendered nonconductive) and at which the dielectric material is ablated. More specifically, the inventors have found that clearing is better effected when the electrode material is etched back or rendered insulating faster than the dielectric material. Single wall carbon nanotubes and conductive polymers polyaniline and PEDOT clear at a rate faster than either of the silicone or acrylic dielectrics ablate. Experimental verification of this phenomenon for SWCNT electrodes on silicone dielectric is depicted in the microscope image of FIG. 4. The image clearly shows a relatively small ablated dielectric area 18 surrounded by a much larger ablated electrode area 20, which indicates the electrode material etched back more quickly than dielectric material, both of which occurred over the same amount time.

In addition to controlling the relative rates of clearing between the electrode and dielectric, the inventors have found that controlling the overall rate of etching or clearing of the film structure as a whole may affect the successfulness of the clearing process. In particular, a "slow clearing" approach, i.e., clearing that occurs at a rate on the order of milliseconds to seconds (in contrast to the relatively "fast" clearing undergone by metallized films), maintains the temperature of the electrode material at the site of the fault at a level that allows for accelerated oxidation of the electrode, yet is below that which will result in combustion of the electrode binder or dielectric material. Preventing combustion of the dielectric material reduces tracking, the benefits of which have been explained above.

Figure 5:
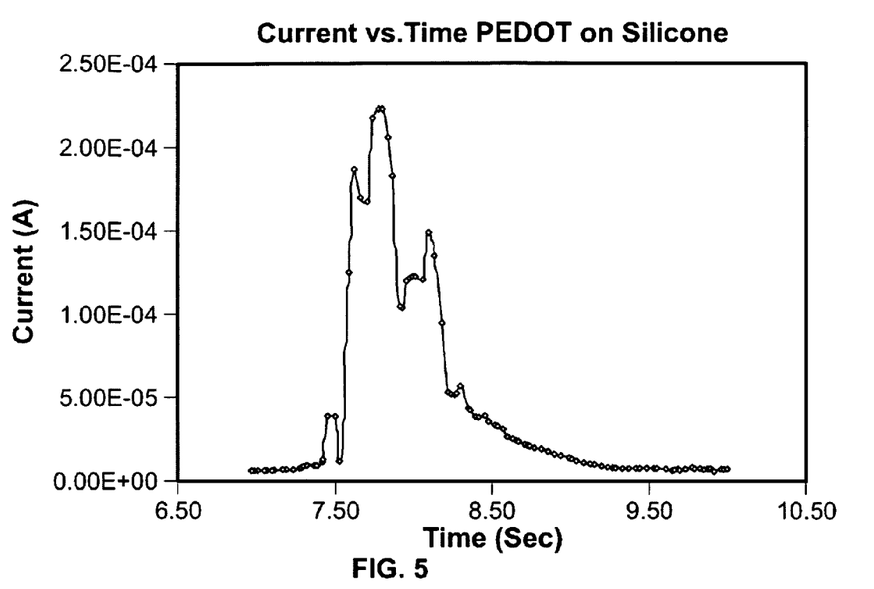
FIG. 5 is a graph of the clearing profile of a compliant capacitive structure of the present invention in terms of the current measured through a fault experienced by the structure.

This slow clearing process is illustrated in the graph of FIG. 5 which charts the clearing profile (in terms of current at the fault site over time) of a compliant capacitive structure of the present invention, namely one comprising a silicone dielectric and a PEDOT electrode. Here, clearing is not complete until about 2 seconds after the onset of a short circuit event, i.e., the current through the fault is not completely interrupted until about 2 seconds after it is initiated—a rate which is on the order of at least about 100 times slower than the clearing rates of capacitive structures made of metal electrodes.

The rate of fault clearing may be controlled by limiting the amount of current that passes through the fault. This may be accomplished by limiting the amount of current emitted by the power supply used to power the capacitive structure. Accordingly, a system of the present invention comprises a power supply which supplies current sufficient to optimally operate the subject capacitive structures (e.g., transducers) (typically, for EPAM applications, about 0.5 mA) but no greater than an acceptable maximum current to enable "slow" clearing to take place upon the occurrence of a fault within the capacitive structure. In another variation, a system of the present invention comprises a power supply that may be capable of high current output yet further comprises additional circuitry, e.g., a current-limiting resistor, to prevent an over-currrent situation which cannot enable a slow rate of clearing. Alternatively, the system or power supply may comprise circuitry to detect a fault condition within the capacitive structure/device and modulate the current output to a level so as to provide slow clearing of the fault.

Figure 6:
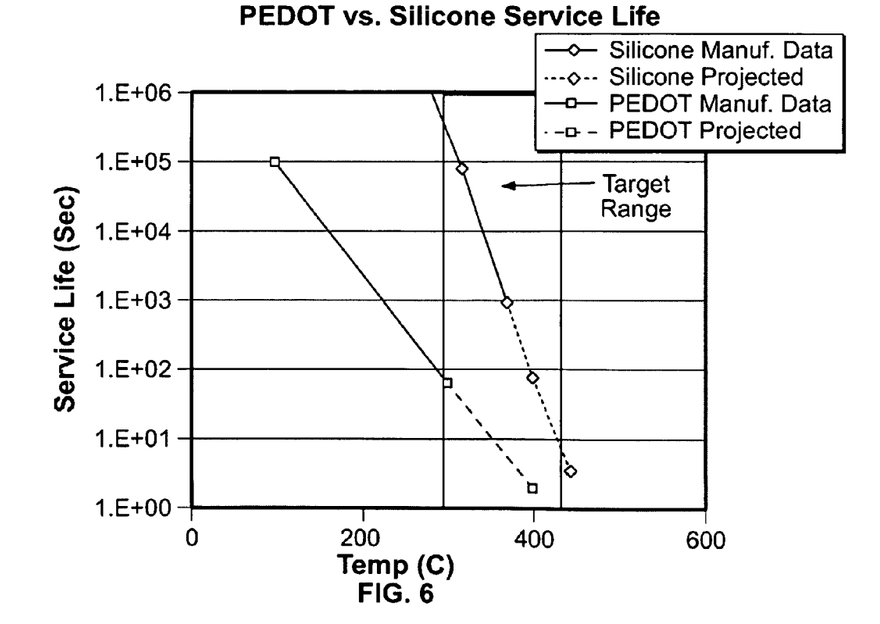
FIG. 6 is graphical illustration of the functional lifetime of a compliant capacitive structure of the present invention when operated under various temperature conditions.

Regardless of how the current to the capacitive structure is limited, such current is maintained within an operating range so as to raise the electrode temperature to an optimum level or range within which the electrode material is rendered insulating at a slow clearing rate, yet where the dielectric material remains substantially undamaged by the heat. FIG. 6 illustrates the target temperature range to be achieved by Joule heating due to the current in terms of the functional service lives of the electrode and dielectric materials. Here, the target temperature at which the electrode material is able to clear at the desired rate and at which the dielectric material remains substantially undamaged is in the range from about 300° C. to about 430° C. Below this range, the temperature is insufficient to effect clearing in a timely manner. Above this range, the silicone dielectric becomes damaged, which can lead to catastrophic failure.

Another variation of the present invention includes capacitive film structures with one or more of the electrode layers having a physical configuration or microgeometry that enables the electrodes to stretch or extend during activation to provide or enhance the overall self-healing ability of the film structure. By introducing fine-scale geometry, i.e., microgeometry, along the planar surface of the electrode material, the electrodes are rendered stretchable. Such fine-scale, non-planar (not flat or smooth) geometry may comprise protuberances or texturing provided by a porous assembly of conductive particles or the like in electrical contact with one another. For example, metal nanoclusters may be deposited on the electrode surface by a metal salt reduction process or by electrostatic self-assembly. In other embodiments, a disordered mat of conductive strands, such as nickel nanofilaments, may be used. Alternatively, the microgeometry may comprise undulations in a cross-sectional dimension of the electrode layer, as in the case of corrugated electrodes. The non-planar geometry may also be created by providing a plurality of microcracks (none of which completely transects the conductive path of the electrode) within the electrode layer. Such microcracks may be induced in the metal material by applying a tensile strain of greater than 0.5%, understanding that when subjected to a multiple cycles of tensile strain greater than 0.5%, the cracking may undesirably propagate.

Figure 7:
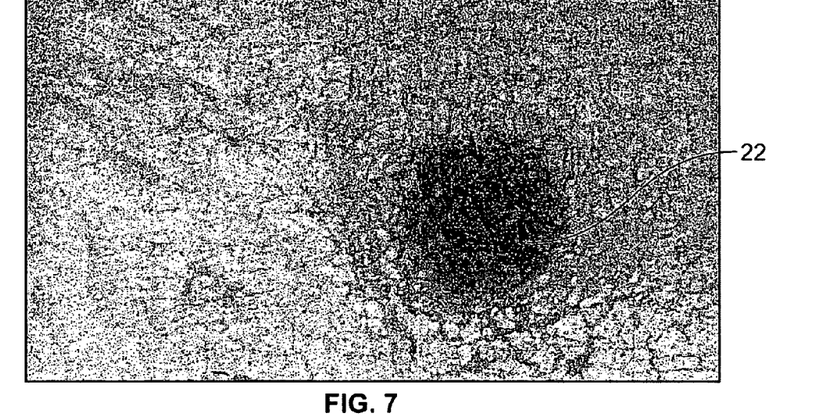
FIG. 7 is a microscopic image of a clearing of a capacitive structure of the present invention comprising corrugated metal electrodes.

All such stretchable configurations of the metal electrode material are thin enough, i.e., less than about 200 nm, and sufficiently conductive to achieve high current density in the vicinity of a fault so that the fault area is heated enough to physically ablate or chemically react into a non-conductive form. Metal materials suitable for the stretchable, clearable electrodes for use in dielectric elastomer actuators may be organic or metallic. Such metal materials include but are not limited to silver, gold, platinum, aluminum, nickel, copper, etc. FIG. 7 illustrates experimental verification of a clearing 22 of a capacitive structure of the present invention comprising corrugated sputtered silver electrodes.

Optionally, an insulating encapsulant may be provided over the stretchable electrode layers to isolate the electrodes from the atmosphere and, hence, from the vicinity of faults when they occur. As the encapsulant has dielectric breakdown strength which is greater than that of ambient air, the size of the spark gap required to support the operating voltage of the transducer is reduced. Thus, the clearing radius is minimized, and losses in transducer performance are minimized with each clearing event. Preventing atmospheric exposure to the electrode material also suppresses ozone generation. By physically sealing the faults once they occur, the leakage current conducted through the fault by surface tracking and atmospheric ozone is minimized. Suitable encapsulation materials for use with the subject electrodes include, but are not limited to, silicone (PDMS) and phenyl-substituted silicone gels. The phenyl-substituted gels are advantageous in that the higher aromaticity, i.e., the ratio of non-carbon to carbon atoms, tends to yield a more complete combustion with fewer carbon particulates, less tracking, smaller spark gaps and, thus, smaller clearings. Other suitable encapsulant materials include but are not limited to silicone grease, polyurethanes, PDMS oil, and mineral oil. Another approach to excluding the atmosphere from the environment of the fault involves enclosing the capacitive structure in an envelope of sulfur hexafluoride gas.

All of the previously mentioned elastomeric dielectric materials, such as the polyurethane and acrylic elastomers, are suitable for use with the stretchable metal electrodes in providing the subject capacitive structures. Due to its heat resistance, polydimethylsiloxane is also a suitable elastomeric dielectric material for use with the stretchable electrode materials.

There may be instances when a dielectric elastomer actuator does not have enough energy stored to clear a fault. For example, if the fault occurs at a low voltage, such as when the transducer is charging, stored energy may be minimal. Or if the device is small, the total capacitance may not be sufficient to store enough energy to clear the fault, i.e., sufficient energy to create a spark gap in a single pulse. As such, multiple discharges are then required to make the clearing.

The inventors have found that to effectively clear electrodes, the average rate of energy or current input to the transducer employing the subject capacitive structures must be sufficiently low such that the bulk of the dielectric material does not rise to a destructive temperature. As such, another system of the present invention employs a power supply configured to supply a series of instantaneous bursts of energy, i.e., current spikes or pulses, where, for example, each burst may be supplied by the discharging of a capacitor storing about 0.1 to about 10 mJ of energy. By discharging the energy over a relatively short duration of the pulse, e.g., less than about 10 microseconds, heat transfer to adjacent dielectric material is negligible, and it is primarily the electrode, not the dielectric, that instantaneously rises to a destructive temperature. The subject power circuitry sets an inter-pulse interval sufficiently long enough, e.g., from about 10 milliseconds to about 1 second, such that the average power transferred to the vicinity of the fault does not overheat the larger volume of the adjacent dielectric material. Limiting the average power to less than about 0.25 W is sufficient to preserve the dielectric material. An example of such a power circuit would be one that supplies approximately a 1 mJ pulse every 10 msec, thus, having an average power output of about 0.1 W.

Figure 8A:
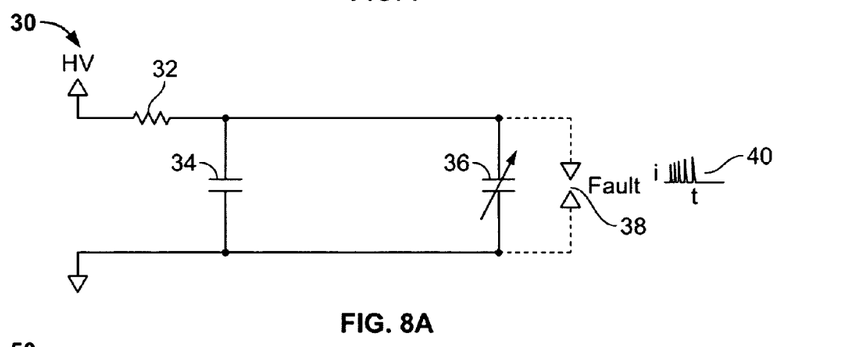
FIG. 8A is a schematic illustration of a power supply suitable to power the capacitive structures of the present invention.

One embodiment of a power circuit which meets the above-described specifications is schematically shown in FIG. 8A. Power circuit 30 has "spot-knocking" circuit design, conventionally used in the art for removing imperfections in the surface of the metal electrodes in cathode ray tubes. See, for example, those circuits disclosed in U.S. Pat. No. 4,326,762. Circuit 30 includes a current limiter 32 which extinguishes the fault arcing between current pulses and limits the rate of thermal energy input within the vicinity of the fault. A capacitor 34 may be used to increase the energy transferred to the fault, schematically shown as spark gap 38, with each pulse, and to extend the interval between pulses. In some cases this capacitor may not be necessary, since the transducer itself 36 provides an inherent capacitance. A current response for a metal electrode clearing in, for example, four pulse is shown schematically next to the spark gap 38. As portions of the electrode near the fault are ablated back, the insulating gap that the charge must jump increases in length. A correspondingly higher voltage is reached before the next knock. Since the rate of capacitor charging is limited, for example by resistor 32, the interval between knocks grows longer. The spark gap continues to increase until sufficient to support the working voltage of the transducer, at which point knocking ceases. As such, an effective spot knocking circuit applies pulses of current sufficient to ablate portions of the electrode, or render them insulating, and also has provisions to extinguish the electrical arc between pulses.

Figure 8B:
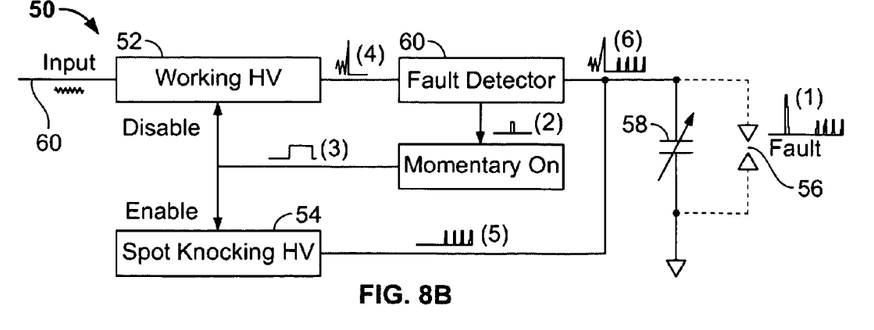
FIG. 8B is a schematic illustration of another power supply suitable to power the capacitive structures of the present invention.

Another embodiment of a power supply suitable for clearing of the subject compliant or stretchable electrodes is illustrated in FIG. 8B. Power circuit 50 includes a working supply of high voltage 52 and an auxiliary "spot knocking" voltage supply 54 that is configured to engage temporarily upon detection of a fault 56 in capacitive load 58 by fault detector 60. An exemplary fault detector 60 includes a leaky current integrator circuit combined with a thresholding means such as a diode drop or voltage comparator. When overcurrent associated with a fault is sensed (1), the fault detector triggers (2) a circuit element, such as a monostable vibrator or "one shot", which in turn provides a signal (3) that temporarily disables (4) the working power supply 52 and enables the spot knocking power supply 54. The system is in this "fault knocking" mode for about 0.1 to about 10 seconds. Once the spot knocking circuit is enabled, it provides a series of current pulses (5) suitable for clearing the fault as described previously. The composite action of these two circuit elements (6) tracks the current signal from the input 60 to the working voltage supply 52, then, after a fault occurs, provides a series of pulses that clears the fault. Upon a clearing event, input to the working voltage supply 52 resumes.

With the improvements in fault tolerance provided by the subject invention, the effective dielectric strength of compliant capacitive devices is increased, thereby improving performance of the capacitive structures and devices. With improved dielectric strength, thinner films may be used for constructing, for example, compliant transducers, which in turn reduces the amount of pre-straining of the dielectric film that may be required to achieve the desired force and stroke outputs. Further, this enables lower absolute voltages to achieve the desired actuation fields.

The invention is not to be limited to that which is described or indicated as contemplated with respect to each variation of the invention. Various changes may be made to the invention described and equivalents (whether recited herein or not included for the sake of some brevity) may be substituted without departing from the true spirit and scope of the invention. Also, it is contemplated that any optional feature of the inventive variations described may be set forth and claimed independently, or in combination with any one or more of the features described herein.

Reference to a singular item herein includes the possibility that there are plural of the same items present. More specifically, as used herein and in the appended claims, the singular forms "a," "an," "said," and "the" include plural referents unless the specifically stated otherwise. In other words, use of the articles allow for "at least one" of the subject item in the description above as well as the claims below. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation. Without the use of such exclusive terminology, the term "comprising" in the claims shall allow for the inclusion of any additional element—irrespective of whether a given number of elements are enumerated in the claim, or the addition of a feature could be regarded as transforming the nature of an element set forth in the claims. Stated otherwise, unless specifically defined herein, all technical and scientific terms used herein are to be given as broad a commonly understood meaning as possible while maintaining claim validity.

The invention claimed is:

1. A method of fabricating a compliant structure having self-healing properties under normal operating conditions, the method comprising:
   providing a dielectric film comprising an elastomeric material having a modulus of elasticity less than about 100 MPa; and
   applying an electrode layer to each side of the dielectric film, the electrode layers comprising a compliant conductive material capable of withstanding cyclic strains greater than 0.1% without failure due to mechanical fatigue;
   wherein a fault within the structure is clearable at a rate on the order of milliseconds to seconds upon onset of the fault.

2. The method of claim 1, wherein the elastomeric and conductive materials are selected such that the electrode layers become insulating or ablate faster than the dielectric film ablates during a fault clearing event.

3. The method of claim 1, wherein the conductive material comprises a metal, wherein the method further comprises rendering the metal stretchable.

4. The method of claim 3, wherein rendering of the stretchable metal comprises depositing conductive nanoclusters on the metal.

5. The method of claim 3, wherein the rendering of the stretchable metal comprises providing a mat of conductive nanofilaments on the metal.

6. The method of claim 3, wherein the rendering of the stretchable metal comprises forming undulations in a cross-sectional dimension of the metal.

7. The method of claim 3, wherein the rendering of the stretchable metal comprises forming microcracks in the metal.

8. The method of claim 3, further comprising encapsulating the electrode layers.

9. A capacitive structure having self-healing properties under normal operating conditions, the structure comprising:
   a dielectric film comprising an elastomeric material having a modulus of elasticity less than about 100 MPa; and
   an electrode layer on each side of the dielectric film, the electrode layers comprising a compliant conductive material capable of withstanding cyclic strains greater than 0.1% without failure due to mechanical fatigue;
   wherein a fault within the structure is clearable at a rate on the order of milliseconds to seconds upon onset of the fault.

10. A capacitive structure having self-healing properties under normal operating conditions, the structure comprising:
    a dielectric film comprising an elastomeric material having a modulus of elasticity less than about 100 MPa; and
    a compliant conductive material on at least a portion of the dielectric film, the conductive material capable of withstanding cyclic strains greater than 0.1% without failure due to mechanical fatigue;
    wherein a fault within the structure is clearable at a rate on the order of milliseconds to seconds upon onset of the fault.

11. The capacitive structure of claim 10, wherein the elastomeric material comprises one of silicone, acrylic and polyurethane.

12. The capacitive structure of claim 10, wherein the conductive material comprises poly3,4-ethylenedioxythiophene, polyaniline, carbon nanotubes or a combination thereof.

13. The capacitive structure of claim 10 wherein the conductive material comprises a stretchable metal.

14. The capacitive structure of claim 10, wherein the conductive material comprises a non-planar geometry.

15. The capacitive structure of claim 14, wherein the non-planar geometry comprises the provision of one of nanoclusters, microfilaments, corrugations and microcracks within the metal.

16. The capacitive structure of claim 10, wherein the electrode layers are encapsulated.

17. The capacitive structure of claim 10, wherein the structure forms part of a transducer.

18. The capacitive structure of claim 17, wherein the transducer forms part of an actuator, a generator or a sensor.

19. A system comprising:
    a capacitive structure of claim 10; and
    a power circuit for supplying current wherein the supplied current is greater than a selected maximum current upon occurrence of a fault clearing event within a capacitive structure, wherein the maximum current is sufficient to raise the temperature of the conductive material of the capacitive structure to a temperature at which the conductive material is ablated or rendered insulating and wherein the elastomeric material remains substantially undamaged by the temperature.

20. The system of claim 19, further comprising current-limiting circuitry adapted to limit current supplied by the power supply to the selected maximum current.

21. The system of claim 20, wherein the current-limiting circuitry comprises a current-limiting resistor.

22. The system of claim 19, further comprising circuitry configured to detect a fault within the capacitive structure and to modulate the supplied current to enable slow clearing of the fault.

23. A system comprising:
    a capacitive structure of claim 10; and
    a power circuit for supplying current wherein the supplied current comprises a series of current pulses, wherein an electrical arc of a fault clearing event within the capacitive structure is extinguished between pulses, and the net rate of power delivery to the fault is sufficiently low wherein the elastomeric material remains substantially undamaged by the temperature of the electrical arc.

24. The system of claim 23, wherein the power supply comprises a spot-knocking circuit.

25. The system of claim 23, wherein the average power output of the power supply is less than about 0.25 W.

26. A method of operating the capacitive structure of claim 10, the method comprising:
   supplying a current to the capacitive structure; and
   upon the occurrence of a fault clearing event, maintaining the current at a selected maximum current, wherein the maximum current is sufficient to raise the temperature of the conductive material to a temperature at which the conductive material is ablated or rendered insulating and at which the elastomeric material remains substantially undamaged by the temperature.

27. The method of claim 26, further comprising limiting the supplied current to the selected maximum current.

28. A method of operating the capacitive structure of claim 10, the method comprising:
   supplying an operating current to the capacitive structure; and
   upon the occurrence of a fault clearing event, changing the operating current from the operating current to a series of current pulses, wherein an electrical arc of the fault clearing event within the capacitive structure is extinguished between pulses, and wherein the average rate of power delivered to the fault clearing event is sufficiently low wherein the elastomeric material remains substantially undamaged by the temperature of the electrical arc.

29. The method of claim 28, wherein the duration of each current pulse is less than about 10 microseconds and the inter-pulse interval is from about 10 milliseconds to about 1 second.

* * * * *